United States Patent [19]

Squire

[11] Patent Number: 5,006,382

[45] Date of Patent: Apr. 9, 1991

[54] AMORPHOUS COPOLYMERS OF PERFLUORO-2,2-DIMETHYL-1,3-DIOXOLE

[75] Inventor: Edward N. Squire, Spring Hill, Fla.

[73] Assignee: E. I. du Pont de Nemours and Company, Wilmington, Del.

[21] Appl. No.: 509,411

[22] Filed: Apr. 9, 1990

Related U.S. Application Data

[60] Division of Ser. No. 458,012, Dec. 28, 1989, which is a division of Ser. No. 148,579, Jan. 26, 1988, which is a division of Ser. No. 904,095, Sep. 4, 1986, Pat. No. 4,754,009, which is a continuation-in-part of Ser. No. 723,649, Apr. 16, 1985, abandoned, which is a division of Ser. No. 591,486, Mar. 20, 1984, Pat. No. 4,530,569, which is a continuation-in-part of Ser. No. 294,789, Aug. 20, 1981, abandoned.

[51] Int. Cl.$^5$ .................... B29D 22/00; B29D 23/00
[52] U.S. Cl. .................... 428/35.7; 428/36.91; 428/422; 516/247
[58] Field of Search .................... 428/35.7, 36.91, 422

[56] References Cited

U.S. PATENT DOCUMENTS

| | | | |
|---|---|---|---|
| 2,468,664 | 4/1949 | Hamford et al. | 526/228 |
| 3,969,288 | 7/1976 | Grut | 260/21 R |
| 3,978,030 | 8/1976 | Resnick | 526/24.7 |
| 4,059,469 | 11/1977 | Mattimor et al. | 156/108 |
| 4,173,033 | 10/1979 | Sako et al. | 361/323 |
| 4,362,785 | 12/1982 | Schultz et al. | 428/480 |
| 4,420,225 | 12/1983 | Bäuer et al. | 350/409 |
| 4,530,567 | 7/1985 | Squire | 350/96.34 |
| 4,543,294 | 9/1985 | Sakagami et al. | 428/422 |
| 4,617,350 | 10/1986 | Maeda et al. | 525/153 |
| 4,620,262 | 10/1986 | Olsen | 361/323 |
| 4,640,866 | 2/1987 | Suzuki | 428/422 |
| 4,680,220 | 7/1987 | Johnson | 428/241 |
| 4,720,428 | 1/1988 | Ohmori et al. | 428/373 |
| 4,743,480 | 5/1988 | Campbell et al. | 428/36 |
| 4,747,662 | 5/1988 | Fitz | 350/96.32 |
| 4,756,599 | 7/1988 | Maeda et al. | 350/91.29 |
| 4,758,067 | 7/1988 | Tatsukami et al. | 350/96.34 |

FOREIGN PATENT DOCUMENTS

| | | |
|---|---|---|
| 835589 | 2/1970 | Canada . |
| 0128517 | 12/1984 | European Pat. Off. . |
| 2654986 | 6/1977 | Fed. Rep. of Germany . |
| 2813622 | 10/1979 | Fed. Rep. of Germany . |
| 233443 | 2/1986 | Fed. Rep. of Germany . |
| 46-37972 | 11/1971 | Japan . |
| 50-2256 | 1/1975 | Japan . |
| 52-10554 | 1/1977 | Japan . |
| 54-100477 | 8/1979 | Japan . |
| 54-135400 | 10/1979 | Japan . |
| 55-72025 | 5/1980 | Japan .................... 361/323 |
| 55-159975 | 12/1980 | Japan . |
| 56-8321 | of 1981 | Japan . |
| 57-84403 | 5/1982 | Japan . |
| 59-116701 | 7/1984 | Japan . |
| 59-155435 | 9/1984 | Japan . |
| 59-195203 | 11/1984 | Japan . |
| 59-200201 | 11/1984 | Japan . |
| 60-19106 | 1/1985 | Japan . |
| 60-147703 | 8/1985 | Japan . |
| 60-205403 | 10/1985 | Japan . |
| 60-260905 | 12/1985 | Japan . |
| 61-103107 | of 1986 | Japan . |
| 61-252507 | of 1986 | Japan . |
| 61-20909 | 1/1986 | Japan . |
| 61-63802 | 4/1986 | Japan . |
| 61-114208 | 5/1986 | Japan . |
| 61-179735 | 8/1986 | Japan . |
| 61-223806 | 10/1986 | Japan . |
| 61-258813 | 11/1986 | Japan . |
| 62-47605 | 3/1987 | Japan . |
| 819218 | 5/1981 | U.S.S.R. . |

Primary Examiner—Joseph L. Schofer
Assistant Examiner—N. Sarofim
Attorney, Agent, or Firm—Paul R. Steyermark

[57] ABSTRACT

Articles made from amorphous dipolymers of perfluoro-2,2-dimethyl-1,3-dioxole with tetrafluoroethylene having high glass transition temperatures of 140° C. or higher, low indices of refraction, and good physical properties, and low dielectric constants, include, among others, substrates for circuit boards, composites, sheets and films, optical lenses, and electronic current carrying devices.

2 Claims, 3 Drawing Sheets

AMORPHOUS COPOLYMERS OF PERFLUORO-2,2-DIMETHYL-1,3-DIOXOLE

This is a division of application Ser. No. 07/458,012, filed Dec. 28, 1989, which is a divisional of application Ser. No. 07/148,579, filed Jan. 26, 1988, which was a divisional of application Ser. No. 904,095, filed Sept. 4, 1986, now U.S. Pat. No. 4,754,009, which was a continuation-in-part of application Ser. No. 723,649, filed Apr. 16, 1985, now abandoned, which was a divisional of application Ser. No. 591,486, filed Mar. 20, 1984, now U.S. Pat. No. 4,530,569, which was a continuation-in-part of application Ser. No. 294,789, filed Aug. 20, 1981, now abandoned.

CROSS-REFERENCE TO RELATED APPLICATION

This is a divisional of my copending application Ser. No. 07/148,579 filed Jan. 26, 1988, which was a divisional of application Ser. No. 904,095, filed Sept. 4, 1986, now U.S. Pat. No. 4,754,009, which was a continuation-in-part of my then copending application Ser. No. 723,649, filed Apr. 16, 1985, now abandoned, which was a divisional of application Ser. No. 591,486, filed Mar. 20, 1984, now U.S. Pat. No. 4,530,569, which was a continuation-in-part of my then copending application Ser. No. 294,789, filed Aug. 20, 1981, and now abandoned.

BACKGROUND OF THE INVENTION

This invention relates to certain amorphous perfluoropolymers which are particularly suitable as cladding materials in optical fiber constructions as well as in certain electronics applications, molded articles, and films.

While tetrafluoroethylene homopolymers and copolymers have many excellent properties, they usually suffer from low modulus, especially at elevated temperature; poor creep resistance; insolubility; and in some cases intractability. Various fluoropolymers have been proposed from time to time for cladding optical fibers, mainly because of their low refractive indices. A good polymeric cladding material for optical fibers should be completely amorphous because crystallites present in polymers would cause light scattering. Further, it should have a high glass transition temperature, $T_g$, especially if intended for use at high temperatures because above its $T_g$ it would lose some of its desirable physical properties and in particular it would be unable to maintain good bonding to the fiber core. A desirable $T_g$ would be above 140° C., preferably above 180° C., especially above 220° C. Suitable, entirely amorphous fluoropolymers having significantly high $T_g$'s have not been heretofore reported.

U.S. Pat. No. 3,978,030 to Resnick describes certain polymers of perfluoro-2,2-dimethyl-1,3-dioxole (PDD), which has the following formula:

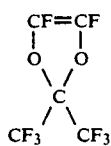

The above patent describes both homopolymers of PDD, which are not further characterized, and a crystalline copolymer with tetrafluoroethylene (TFE), which has a melting point of about 265° C.

Since Resnick's discovery of PDD homopolymer, it has been established that the material is amorphous and has a very high $T_g$ of about 330° C. The homopolymer, however, is not readily melt-processable because of poor flow and some degradation.

Crystalline copolymers of PDD with TFE cannot be used in many applications, where, for example, optical clarity, dimensional stability, solubility, or high $T_g$ is required.

The polymers of U.S. Pat. No. 3,978,030 have thus not been produced commercially, in spite of the fact that perfluoro polymers having desirable properties would have many possible uses in various high technology applications.

It has now been found that the dioxole PDD forms amorphous copolymers that have unique properties that make them particularly suitable for a number of special applications requiring high performance.

SUMMARY OF THE INVENTION

According to this invention, there are now provided articles made from amorphous copolymers of 65-99 mole % of perfluoro-2,2-dimethyl-1,3-dioxole with complementary amounts of tetrafluoroethylene, the glass transition temperature of the copolymer being at least 140° C.;

As used herein, the term "complementary" means that the mole percentage of perfluoro-2,2-dimethyl-1,3-dioxole plus the mole percentage of tetrafluoroethylene add together to 100%.

DETAILED DESCRIPTION OF THE INVENTION

Figure 1:
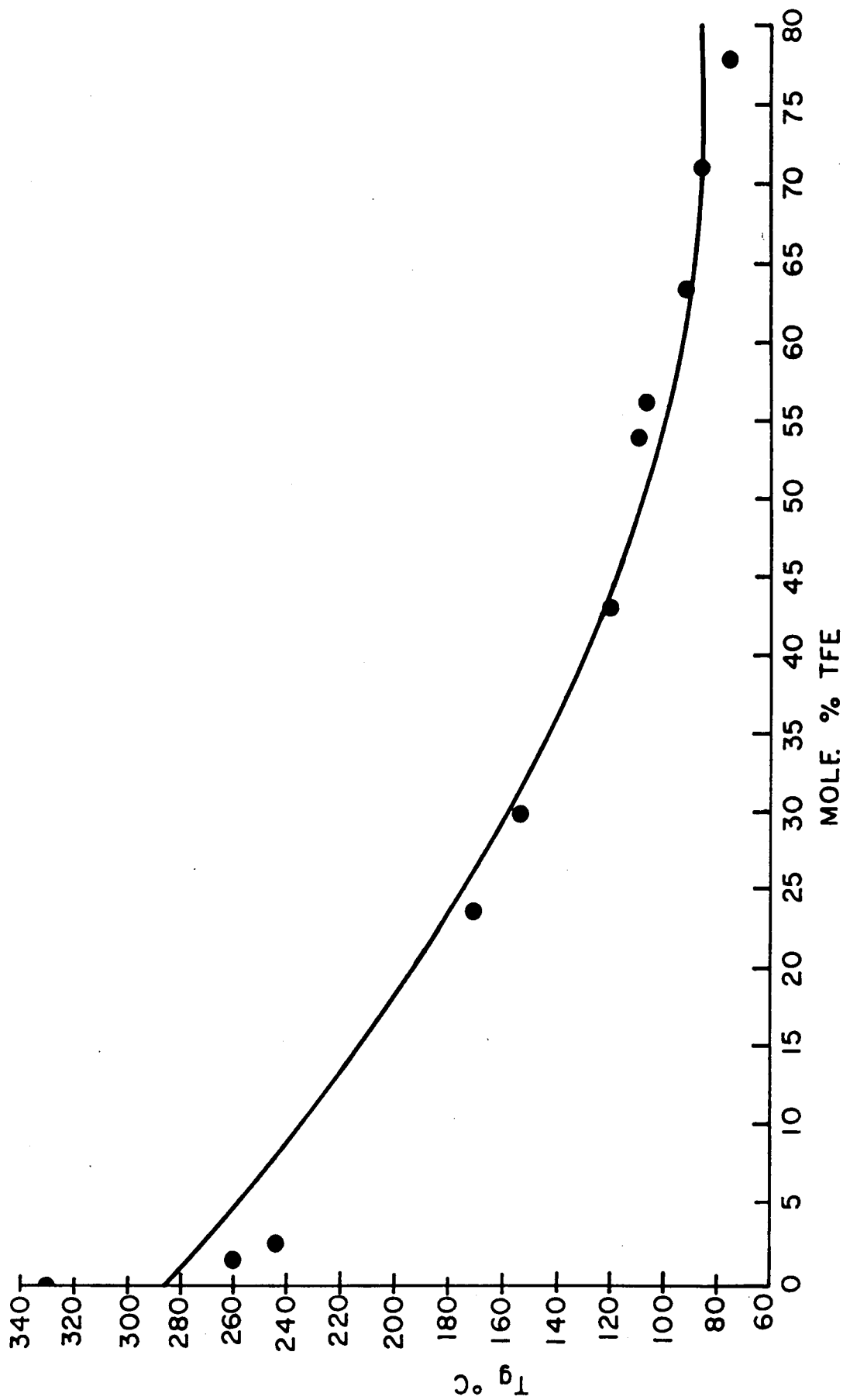
FIG. 1 is a plot of the molar fraction of TFE in dipolymers with PDD versus the $T_g$ of the dipolymer.

The copolymers useful in the present invention preferably have a $T_g$ of at least 180° C. The especially preferred copolymers useful in the present invention have a $T_g$ of at least 220° C. TFE is made in large quantities by E. I. du Pont de Nemours and Company.

The amorphous copolymers useful in the present invention, are soluble at room temperature in perfluoro(2-butyltetrahydrofuran), which is a commercial solvent available from 3 M Company under the tradename FC-75. In addition, they have the following outstanding combination of properties:

1. high glass transition temperatures;
2. high moduli, especially at elevated temperatures;
3. high strengths, especially at elevated temperatures;
4. low creep under compressive load.
5. melt fabricability at moderate temperatures;
6. fabricability into films and coatings by solvent casting;
7. low temperature sprayability;
8. unusually low refractive indices;
9. excellent dielectric properties;
10. excellent chemical resistance.

The first four characteristic properties of the copolymers of the present invention are particularly advantageous in applications where the polymer must bear a load at an elevated temperature. Because of their chemical inertness and excellent dielectric properties, they also are suitable for a number of specialized electrical applications.

Also, because of their chemical inertness, good optical properties, and good physical properties, they are suitable for the manufacture of optical lenses. The polymers of this invention can also be filled or reinforced with solid substances to make composite materials. The additives include, i.a., graphite, graphite fibers, aramid fibers, mica, wollastonite, glass fibers, etc. Fibrous material may be in the form of loose fibers, fabrics, or mats. Such composite materials show enhancement of desirable properties such as modulus, for example.

Films of the amorphous copolymers of this invention are useful when thermally laminated to other polymeric films or metal foils. A laminate of the amorphous copolymers of this invention with copper foil is a superior substrate for flexible circuit production because the copolymer bonds directly with the copper without the necessity for an intervening adhesive. Conventional copper/adhesive/polyimide/adhesive/copper structures for electronic circuit substrates have the deficiency of high dielectric constant material next to copper. This limits the ultimate speed of the electronic circuit. A laminate of copper/amorphous copolymer/copper permits very high circuit speeds because the amorphous copolymer film has a low dielectric constant (2.1) and can be thermally bonded directly to circuit copper.

A thermal laminate of amorphous copolymer/polyimide/amorphous copolymer is useful as an electronic circuit substrate. Compared to polyimide film itself, this laminate is a superior circuit substrate because (a) it may be thermally bonded to copper foil without adhesive; (b) the low water absorption of the amorphous copolymer gives the substrate greater dimensional stability in humid environments; and (c) the low dielectric constant of the amorphous copolymer allows the fabrication of a high speed circuit.

A thermal laminate of amorphous copolymer/polyimide is useful as a vacuum bag for the curing of parts such as helicopter blades made from carbon fiber reinforced thermoset. The high glass transition temperature, thermal stability and low surface energy of the amorphous copolymer give the laminate excellent release properties when this side is placed against the thermoset part to be cured. The polyimide layer of the laminate provides strength to prevent pinholing when the bag enclosing the thermoset part is evacuated and raised to curing temperature. After curing and cooling the laminate is easily separated from the part.

A thermal laminate containing film of amorphous copolymer as its outer faces and a film of oriented polypropylene as the core is useful as a low-cost film structure with outstanding chemical resistance and stain resistance combined with excellent mechanical properties. Such laminates can be used to protect sensitive instruments from environmental damage.

Pipe, tubing and fittings which are made from or lined with the amorphous copolymer of this invention prevent the contamination of the process liquid with metal ions, plasticizer, or degradation products from the fluid handling system. Such fluid handling components are of very high purity, are inert to most common chemicals, and are easily fabricated by injection molding, extrusion, machining from stock. Alternatively, fluid handling system components may be fabricated from metal, glass, or other plastic and subsequently lined with amorphous copolymer of this invention by solution coating, dispersion coating, or electrostatic powder coating. In addition to pipe, tubing and fittings, other useful fluid handling articles made from the amorphous copolymers of this invention are pump housings, pump impellers, valve bodies, valve stems, valve seals, diaphragms, tanks, trays, pipettes, laboratory vessels. Such articles are especially useful in semiconductor processing fluid handling systems where parts-per-billion purity is required in process water and chemicals. Also, in molecular biology research laboratories where extreme purity is required, and microgram quantities must be completely released from the vessels in which they are handled, the fluid handling articles made from the amorphous copolymer of this invention are particularly useful.

The amorphous copolymers of this invention are particularly useful when fabricated into articles to transport materials and components through chemical treatment processes. For example in the manufacturing process for semiconductor chips the silicon wafers must be transported through a series of chemical treatment steps; the containers in which the silicon wafers are carried must be chemically inert to prevent contamination of the chips, and they must be rigid and dimensionally stable to permit precise automatic positioning at each stage of the process. Compared to the conventional fluoroplastics used for such wafer carriers, e.g., the copolymer of tetrafluoroethylene and perfluoro(propyl vinyl ether), the amorphous copolymers of the present invention have greater rigidity and greater dimensional stability. This advantage makes possible the fabrication of larger wafer carriers, e.g, baskets to hold silicon wafers of 30 cm in diameter; wafer carriers made from conventional fluoroplastics are too low in flexural modulus to be useful for wafers larger than about 15 cm in diameter.

Other conveying system components for which articles made from the amorphous copolymers of the present invention are especially well suited are guide rails, conveyor belt links, bearings and rollers, clamps, racks, hooks, positioning pins, robot arm jaws and fingers, gears, cams and similar mechanical parts which must be precisely engineered, have good high temperature mechanical properties, retain dimensions, be chemically pure and chemically inert. Conveying system components made from the amorphous copolymers of this invention exposed to corrosive chemicals or ultrapure water are superior to all conventional fluoroplastics because of the superior high temperature mechanical properties and dimensional stability of the polymers of this invention.

The low dielectric constant (2.1) and low coefficient of thermal expansion of the amorphous copolymers of this invention make them especially useful as dielectrics in electrical and electronic applications. For example, the dielectric used between the separate circuit layers in high speed digital multi-layer circuit boards must be very low in dielectric constant and be very dimensionally stable (comparable to ceramic and copper) from $-20°$ C. up to soldering temperature of approximately $225°$ C. Polyimide is dimensionally stable but has a high dielectric constant ($>3$); in addition it is susceptible to atmospheric moisture; the amorphous copolymers of this invention do not have these deficiencies, and multilayered circuits which have this polymer as a dielectric between circuit layers are capable of greater speed and greater circuit density.

The low moisture absorption, outstanding chemical resistance, purity, thermal stability, and dimensional stability of the amorphous copolymers of this invention make them especially suited for the protection of sensitive electronic circuits an components. Unlike conventional fluoroplastics the polymers of the present invention can be dissolved to form coating and encapsulating solutions. For example, a so-called "smart connector" may be encapsulated by dipping it, pins up, in a solution of the amorphous copolymer of Example 1 and evaporating the FC-75 solvent to leave a protective film of polymer to exclude environmental water and corrosive chemicals. In another embodiment the polymers of this invention may be used instead of a thin layer of gold, so-called "gold flash", to protect electronic connectors from corrosion from atmospheric chemicals. Whole electronic or electro-optic circuits may be encapsulated by the amorphous copolymers of this invention by a solution coating process, which is not possible with conventional fluoropolymers because o their insolubility in practical solvents. It is well known that aqueous dispersions of conventional fluoropolymers may be used to impregnate and encapsulate articles such as glass fabric and metal parts; however, the application of such dispersions is limited to substrates which can tolerate the high baking temperatures (>200° C.) required to fuse the fluoroplastic into a pinhole-free coating. In contrast to aqueous dispersions of conventional fluoroplastics, solutions of the amorphous copolymers of the present invention may be applied to temperature sensitive substrates such as electronic circuits or electronic components made from thermoplastics, and the solvent evaporated at moderate temperature (100° C. or less) to leave a protective polymer film without the necessity of high temperature baking to fuse the polymer.

As the amount of PDD in the copolymers of the present invention increases, the Tg also increases, although not necessarily in a linear fashion. The relationship between the mole fraction of TFE in the dipolymer with PDD and the Tg is shown in FIG. 1. It can be seen, for example, that a copolymer containing about 30 mole percent TFE has a Tg of 153° C., while a copolymer containing about 23 mole % TFE has a Tg of 176° C.

Figure 2:
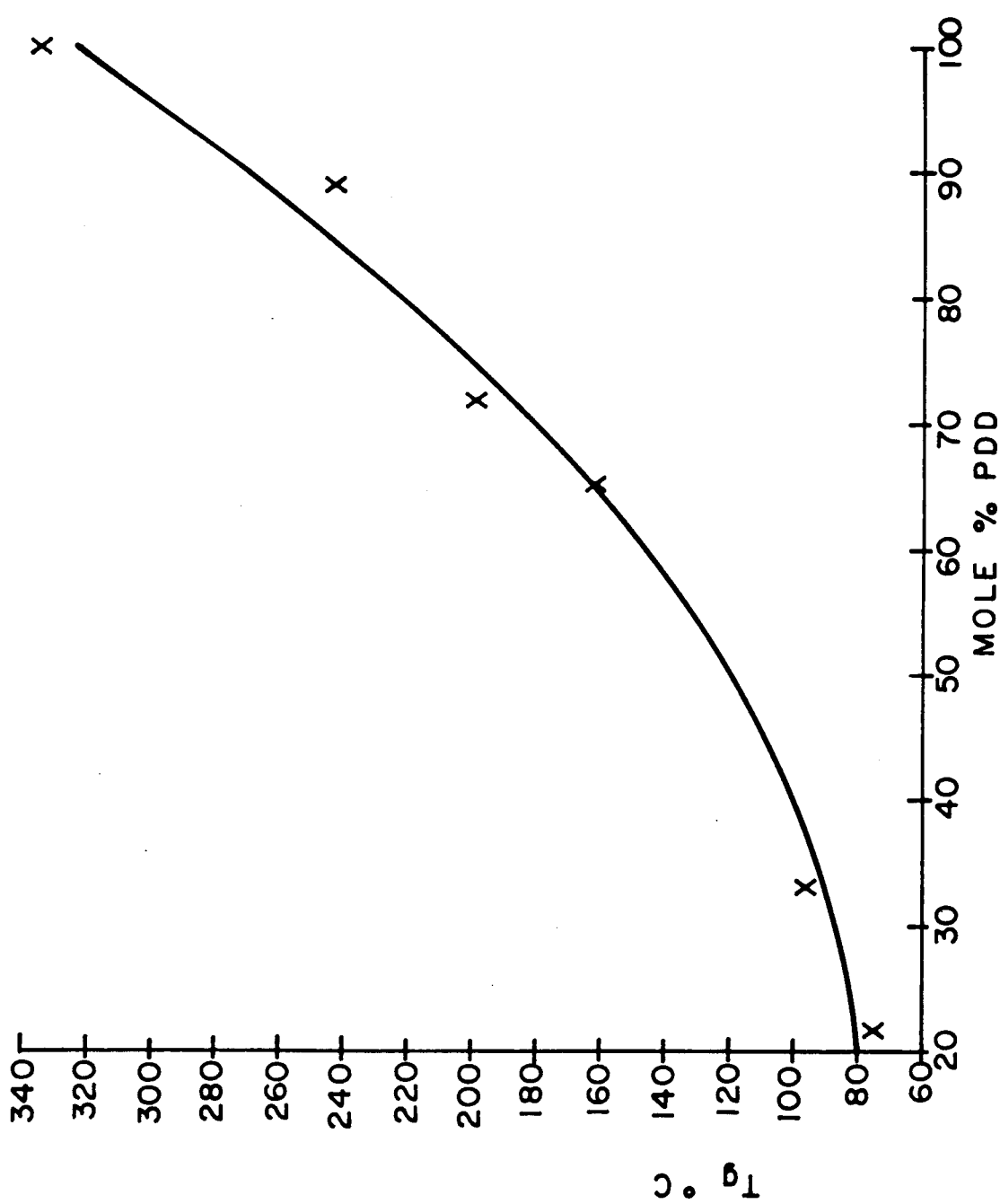
FIG. 2 is a plot of the molar fraction of PDD in dipolymers with TFE versus the $T_g$ of the dipolymer.

FIG. 2 shows the relationship between the mole fraction of PDD in the dipolymer with TFE and the Tg. In this case, the mole fractions of the monomers were determined by a different technique from that used to obtain the plot of FIG. 1.

Tg is determined by differential scanning calorimetry (DSC) according to ASTM method D-3418. Examination of the DSC curve shows only a second order transition and no first order transition, indicating the absence of crystallinity. The relative proportions of the comonomers in the copolymer can be determined by fluorine-19 nuclear magnetic resonance spectroscopy ($^{19}$F NMR). This was the technique used to obtain the plot of FIG. 1. The proportion of hydrogen-containing monomers can be determined by proton NMR together with $^{19}$F NMR.

The proportions of comonomers in the copolymers also can be determined by x-ray fluorescence (XRF). This was the technique used to generate the plot of FIG. 2. Measurements were made on a Philips Electronic Instruments 1404 XRF spectrometer. Samples were in the form of 50 mm disks approximately 1 mm thick. Calibration of x-ray fluorescence intensity as a function of weight % oxygen and fluorine was accomplished using three polymer samples of known composition which bracketed the anticipated fluorine and oxygen content of the unknown PDD-TFE copolymers. These standards were PDD homopolymer, a copolymer of 40 weight % of perfluoro(methyl vinyl ether) with 60 weight % of tetrafluoroethylene, and a copolymer of 96.1 weight % of tetrafluoroethylene with 3.9 weight % of perfluoro(propyl vinyl ether). The compositions of the latter two polymers were determined by infrared spectroscopy methods which had been calibrated by accurate determination of off gases during polymerization.

The analytical crystal used had an effective d spacing of approximately 5.0 nm. The fluorine fluorescence intensity maximum was at 43.5° $2\theta$, and the oxygen intensity maximum at 57.1° $2\theta$. Five PDD-TFE copolymers of unknown composition spanning the composition range of approximately 20 to 90 mole % PDD were analyzed by XRF. Ten replicate determinations of a sample containing 63.7 wt % fluorine and 11.2 wt % oxygen (corresponding to 71.9 mole % PDD, 28.1 mole % TFE) gave a root mean square variance of 0.34% relative in fluorine and 1.9% relative in oxygen.

The copolymers of PDD with TFE are readily melt-processible, so that they can be fabricated into articles by such techniques as, e.g., injection molding and extrusion. Furthermore, they have low refractive indices, which is a particularly desirable feature for optical fiber cladding. Since they are soluble in FC-75, they can be conveniently applied to substrates, such as optical fibers or flexible or rigid circuit boards, from solution to give thin polymer layers. Furthermore, films of these copolymers are clear and transparent, compared with hazy or translucent films of crystalline polymers. For this reason, the amorphous copolymers of the present invention are suitable for such applications as, for example, windows for chemical reactors, especially for processes using or manufacturing hydrogen fluoride.

It is to be noted that, while PDD homopolymers also are amorphous and have good chemical properties, they are not readily melt-fabricable because of some degradation occurring at the high processing temperatures required.

Copolymerization is carried out in the presence of a free radical generator at a temperature suitable for the initiator chosen. Well agitated pressure equipment and a nontelogenic solvent or diluent should be used, preferably one that has sufficient volatility to permit easy removal from the polymer.

This invention is now illustrated by the following examples of certain preferred embodiments thereof, where all parts, proportions, and percentages are by weight, unless otherwise indicated. Most Tg's were determined using Du Pont Differential Thermal Analyzer Model 1090 with 910 or 912 DSC modules. All units have been converted to SI units.

EXAMPLE 1

A 330 mL cold, stainless steel shaker tube was charged with 51 g (0.21 mole) of PDD, 330 g of cold 1,1,2-trichloro-1,2,2-trifluoroethane and 0.2 g of 4,4'-bis(t-butylcyclohexyl) peroxydicarbonate. The tube was sealed, cooled further to between −50° C. and −80° C. in a dry ice-acetone mixture, alternately evacuated and flushed with nitrogen three times, and charged with 1 g (0.01 mole) of TFE. The tube was shaken horizontally with heating 1 hour each at 55° C., 65° C. and 70° C. After cooling to room temperature, the solvent was distilled, leaving behind a solid, white polymer, which was dried in a vacuum oven at 130° C. The monomer composition was found by NMR to be 98 mole % of PDD and 2 mole % of TFE.

EXAMPLE 2

A cold 400 mL stainless steel shaker tube was charged with 270 g of cold 1,1,2-trichloro-1,2,2-trifluoroethane, 42.2 g (0.17 mole) of cold PDD (which had been purified in a final step by passage through silica gel), 0.2 g of 4,4-bis(t-butylcyclohexyl)-peroxydicarbonate; the tube was sealed and further cooled to between −50° C. and −80° C. At this point the tube was placed on a horizontal shaker, connected to the necessary tubing and temperature sensing device. The tube was then alternately evacuated and purged with nitrogen at least 3 times; the evacuated tube was then charged with 2 g (0.02 mole) of tetrafluoroethylene (TFE). Agitation, at the rate of 180 strokes per minute, was commenced and the tube contents were heated to 55° C.; after 1 hour at 55° C., the temperature was raised to 60°, 65°, 70°, and 75° C. and held at each of these subsequent temperatures for 1 hour. The tube pressure was initially 124.1 kPa at 5° C. and gradually increased to 172 kPa at 75° C. The tube and contents were cooled to room temperature and the contents, a thick, white, slurry, were discharged into a still. The solvent was distilled off at room temperature and reduced pressure; the solid polymer was then dried in a vacuum oven at 60° C. and finally at 145° C. in a circulating air oven. The dried polymer weighed 39.4 g; the Tg was 250° C. and the polymer was amorphous as evidenced by the absence of a melting endotherm; the inherent viscosity was 0.0719 m$^3$/kg, determined for a 0.36% w/v solution in perfluoro(2-butyltetrahydrofuran) at 25° C.

Part of the polymer was molded at 300° C. into 0.32 cm thick by 1.3 cm wide bars which were used for the determination of modulus vs. temperature, as shown in Table I; analysis showed it was an 89 mole % PDD/11 mole % TFE polymer.

Another part of the polymer was compression molded at 280°–300° C. into 1 cm thick and 1.3 cm wide bars. Sections of these were used in the deformation under 6.895 MPa compressive load tests shown in Table II.

Another portion of the polymer was compression formed at 280° C. into 0.027 cm thick films. These were tested for tensile properties and reported as polymer C in Table III.

COMPARATIVE EXAMPLE A

A copolymer was made from 2 parts of PDD and 10 parts of TFE according to the exact procedure of Example 3 of U.S. Pat. No. 3,978,030 to Resnick. This polymeric product was extracted for 25 hours with 1,1,2-trichloro-1,2,2-trifluoroethane. About 0.2 percent of the product weight was thus removed; the extracted fraction was a grease and appeared to consist of shaker tube lubricant and a small amount of an unknown fluorocarbon. This obviously was a low molecular weight material. The extracted product had no Tg between 25° and 200° C. It was different from the amorphous copolymers of this invention. The solid extraction residue was a crystalline, rather than an amorphous polymer, as shown by wide-angle x-ray powder diffraction spectroscopy This comparative experiment shows that at monomer ratios employed in Example 3 of U.S. Pat. No. 3,978,030 no amorphous PDD/TFE copolymer is obtained.

COMPARATIVE EXAMPLE B

A mixture of 5.0 g of PDD, 0.100 g of 4,4'-bis(t-butylcyclohexyl)peroxydicarbonate, and 40.0 g of 1,1,2-trichloro-1,2,2-trifluoroethane was placed in a pressure tube. The mixture was thoroughly degassed, sealed, and placed in a constant temperature bath at 30° C. for 20 hours. The polymerization mixture appeared as a thick, translucent slurry of polymer particles dispersed in 1,1,2-trichloro-1,2,2-trifluoroethane. The volatile material was removed by distillation, and the polymer residue was dried at 150° C. for 20 hours to give 4.7 g of PDD homopolymer. The products of four identical runs were combined. The polymer had two glass transition temperatures, at 333° and 350° C.

Some physical properties of a typical PDD homopolymer are compared with those of the 89 PDD/11 TFE dipolymer of Example 2 and those of prior art polymers, as shown below in Tables I and II.

TABLE I

Young's Modulus (GPa) of Melt Fabricated Fluorocarbon Polymers At Three Temperatures

| Polymer Composition | 23° C. | 100° C. | 200° C. |
|---|---|---|---|
| PDD Homopolymer | 0.95 | 0.53 | 0.31 |
| *98 PDD/2 TFE Copolymer (soluble, amorphous) | 1.17 | 0.97 | 0.58 |
| *89 PDD/11 TFE Copolymer (soluble, amorphous) | 1.25 | 0.82 | 0.54 |
| TFE Homopolymer (Commercial) | 0.59 | 0.29 | — |
| US 3,978,030, Example 3, *94 TFE/6 PDD Copolymer (insoluble, crystalline) | 0.58 | 0.20 | — |

*Composition in mole %

It must be mentioned that PDD homopolymer could not be melt-fabricated by compression molding without some degradation (evidenced by gas evolution). Moldings could be obtained within the temperature range 355°–370° C. Above 370° C., the degradation was quite noticeable; below 350° C., the polymer flow was insufficient for producing moldings, and coalescence to a homogeneous test slab was not achieved.

PDD homopolymer could be cast from perfluoro(2-butyltetrahydrofuran) solution. That material had good physical properties (e.g., high modulus) but this technique is impractical for thick parts.

Polymer samples also were tested for deformation under a 1000 psi (6.895 MPa) compressive load. The results, as measured by ASTM D-621, are shown in Table II.

TABLE II

Deformation (%) Under 6.895 MPa Compressive Load

|  | 0.5 Hr. | 1.0 Hr. | 24 Hr. |
|---|---|---|---|
| At 23° C. | | | |
| TFE Homopolymer | 2.4 | 2.5 | 3.6 |
| *Crystalline 94 TFE/6 PDD copolymer of US 3,978,030, Ex. 3 | 0.11 | 0.11 | 0.32 |
| *89 PDD/11 TFE Amorphous, Soluble copolymer | 0.05 | 0.05 | 0.08 |
| At 100° C. | | | |
| TFE Homopolymer | 5.5 | 6.0 | 6.4 |
| *Crystalline 94 TFE/6 PDD copolymer of US 3,978,030, Ex. 3 | 4.2 | 4.4 | 6.4 |
| *89 PDD/11 TFE Amorphous, Soluble | 0.08 | 0.08 | 0.13 |

TABLE II-continued

| | Deformation (%) Under 6.895 MPa Compressive Load | | |
|---|---|---|---|
| | 0.5 Hr. | 1.0 Hr. | 24 Hr. |
| copolymer | | | |

*Composition in mole %

It can be seen that the amorphous, soluble copolymer of this invention has a lower deformation under compressive load than either the well-known TFE homopolymer or the crystalline PDD/TFE copolymer reported by Resnick in U.S. Pat. No. 3,977,030. The difference is particularly remarkable at 100° C.

Because of its low creep under compressive load, as compared to commercial fluoropolymers, this copolymer is, like other copolymers of this invention, suitable in the manufacture of gaskets, especially for use in a corrosive atmosphere, e.g., in chemical reactors, oil drilling equipment, automobile engines, etc.

EVALUATION OF FILMS

Films 0.025–0.05 cm thick were compression molded at 230°–300° C. from polymer granules at 700–7000 kPa. One of these polymers was the amorphous 89 PDD/11 TFE copolymer of the present invention, while the prior art crystalline copolymer was made according to the teaching of U.S. Pat. No. 3,978,030 to Resnick, as described in Comparative Example A herein. The physical properties of these films are reported in the following Table III, where it can be seen that both the modulus and the tensile strength of the amorphous copolymer of this invention are significantly improved over those of the crystalline copolymer. The amorphous copolymer is thus stiffer and stronger.

TABLE III

| Physical Properties of TFE/PDD Copolymers | | |
|---|---|---|
| | Comp. Ex. A (Crystalline Copolymer) | Amorphous Copolymer |
| Mole % PDD | 5–7 | 89 |
| Tg (°C.) | — | 250 |
| Tensile Properties* | (23° C., 50% RH) | |
| Modulus (MPa) | 620 | 1191 |
| Stress (MPa) | | |
| Yield | 15.9 | — |
| Maximum | 20.7 | 30.2 |
| Break | 20.7 | 30.2 |
| Strain (%) | | |
| Yield | 5.5 | — |
| Break | 125.3 | 4.3 |

*ASTM D-1708 and D882A: Moduli derived from stress-strain curve.

EXAMPLE 3

A. Coated Articles

A typical polymer composed of 72 mole % PDD/28 mole % TFE was prepared in accordance with the procedure of Example 2 using an appropriate monomer ratio. The PDD/TFE copolymer was dissolved in perfluoro(2-butyltetrahydrofuran) (FC-75) to form a 5% solution. Two aluminum strips (101.6 mm×12.7 mm×0.127 mm) were washed with 1,1,2-trichloro-1,2,2-trifluoroethane to remove residual processing oils. The aluminum strips were coated with the PDD/TFE polymer by dipping in the solution, then evaporating the solvent in air at room temperature for at least 10 minutes. This dipping/drying process was repeated on the aluminum strips a total of four times to build up a PDD/TFE polymer layer. After the last room temperature drying cycle, the coated aluminum strips were baked in a nitrogen purged oven at 200° C. for 3 hours to complete drying. After cooling to room temperature, one of the coated aluminum strips was partly immersed in 6N hydrochloric acid at 25° C. and the other was partly immersed in 5M aqueous potassium hydroxide solution at 25° C. After immersion in the reagents and for a period of 30 minutes afterwards, there was no evolution of gas, no discoloration of the aluminum sample and otherwise no apparent chemical reaction taking place.

The PDD/TFE-coated aluminum strips were removed from the acid/base reagents. As a comparison, two similar aluminum strips, but uncoated with PDD/TFE, were then immersed in 6N hydrochloric acid and 5M aqueous potassium hydroxide solutions at 25° C. A chemical reaction began immediately in both the acid and base with evolution of gas and discoloration of samples. The uncoated aluminum strip in the potassium hydroxide solution reacted vigorously for 15 minutes, at which time it was removed from the reagent. The uncoated aluminum strip in the hydrochloric acid reacted vigorously and was completely dissolved within 2 minutes after immersion in the reagent.

This example demonstrates that metal articles can be coated with the polymers of this invention and that such a coating offers excellent resistance to corrosion of the metal substrate by aggressive reagents such as concentrated acids and bases.

B. Fabrication of Film and Lamination to Copper Foil

A typical polymer composed of 72 mole % PDD/28 mole % TFE was prepared in accordance with the procedure of Example 2. The polymer was fabricated into a film by heating 5.5 g of the resin to 250° C. between the platens of a hydraulic lamination press under an applied force of 88.9 kN for 10 minutes, then cooling rapidly to 25° C. while the applied pressure was maintained. The round film thus produced measured 140 mm in diameter and varied between 0.14 mm and 0.19 mm in thickness. The polymer film was laminated on both sides to rolled, annealed copper foil 25.4 m thick by contacting the polymer film between two sheets of the copper foil and heating the multilayered structure to 250° C. between the platens of a hydraulic lamination press under an applied pressure of 2.07 MPa for 5 minutes, then cooling rapidly to 25° C. while the applied pressure was maintained. Inspection of the article after removal from the hydraulic press revealed a copper-clad laminate structure, whereby the copper foil was firmly attached to the PDD/TFE polymer film. Various properties of this laminate structure were determined in order to evaluate its suitability in electrical and electronics applications. The results of these tests are given in Table IV.

This example demonstrates that metal foils can be laminated to films fabricated from the polymers of this invention, and that these laminates have unique properties which are highly desirable for electrical and electronics applications.

TABLE IV

| Test (Method) | Result |
|---|---|
| Dimensional Stability: (IPC-FC-241A method 2.2.4) | −0.72% |
| 90° Peel Strength: | 158 newtons/m |

TABLE IV-continued

| Test (Method) | Result |
| --- | --- |
| (IPC-FC-241A method 2.4.9) | |
| Dielectric Constant: (ASTM D-1531 at 1 mhz) | less than 2.3 |
| Dielectric Strength: (ASTM D-149) | 2000 Volt/mil thickness ($7.9 \times 10^7$ volt/m thickness) |
| Volume Resistivity: (ASTM D-257) | $3.0 \times 10^{17}$ ohms-cm ($3.0 \times 10^{15}$ ohms-m) |

C. Fabrication of a Composite Structure

A typical polymer composed of 72 mole % PDD/28 mole % TFE was prepared in accordance with the procedure of Example 2. The PDD/TFE copolymer was dissolved in perfluoro(2-butyltetrahydrofuran) to form a 5% solution. A 101.6 mm ×101.6 mm sheet of commercially available KEVLAR ® aramid fabric was baked under nitrogen atmosphere at 125° C. for 24 hours to remove any absorbed water vapor. After cooling to room temperature the KEVLAR ® fabric was impregnated with the PDD/TFE polymer by immersing the fabric in a shallow pool of the PDD/TFE polymer solution using care to exclude trapped pockets of air. The FC-75 solvent was subsequently allowed to evaporate at room temperature, thereby depositing the PDD/TFE polymer within the fabric in intimate contact with the individual fibers of the fabric. The polymer-impregnated fabric was then dried completely by baking at 200° C. for 4 hours.

The resulting composite structure contained 45% by weight of PDD/TFE resin and was a flat and stiff sheet, as compared to the limp unimpregnated KEVLAR ® fabric. This example demonstrates that fabric materials can be impregnated with the polymers of this invention by suitable application in solution to produce composite structures.

EXAMPLE 4

A copolymer containing 97.2 mole % of PDD and 2.8 mole % of TFE was prepared according to the general technique of this invention. The copolymer had an inherent viscosity of 0.128 m³/Kg, as measured at 30° C. in a 0.0333 Kg/L solution in FC-75, and a Tg of 311° C.

EXAMPLE 5

A PDD copolymer with TFE was prepared as follows:

A 400 mL stainless steel shaker tube was charged with 0.15 g of 4,4'-bis(t-butylcyclohexyl) peroxydicarbonate, 50.0 g (0.205 mole) of PDD, 450 g of 1,1,2-trichloro-1,2,2-trifluoroethane, and 1.5 g (0.015 mole) of TFE and heated at 60° C. for 6 hours. The volatile material was evaporated, and the residue was dried at 150° C. for 24 hours to give 45.3 g of dipolymer. The dipolymer had an inherent viscosity of 0.0927 m³/Kg and a Tg of 261.4° C.

Figure 3:
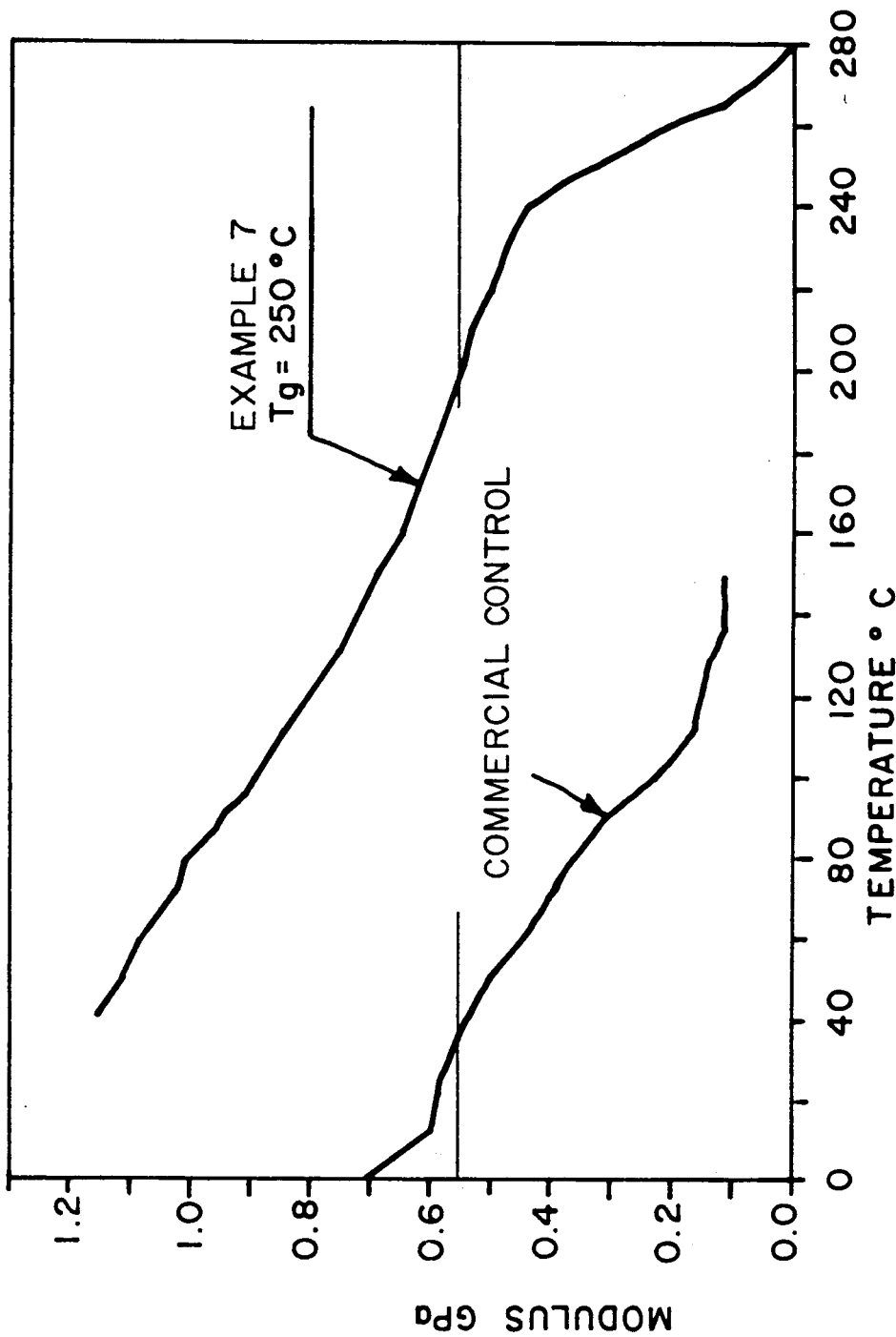
FIG. 3 is a plot of dynamic moduli of a PDD copolymer with TFE and a comparison resin.

FIG. 3 is a plot of dynamic flex modulus vs. temperature of a polymer of the same type from a different run (Tg=250° C.). This curve was obtained using a Du Pont DMA-981 Dynamic Mechanical Analysis module with temperature controlled by a Du Pont Series 99 thermal analyzer. The heating rate was controlled at 10° C./min. The polymer sample was in the form of a small compression molded bar. In this instrument, the sample is oscillated at its resonant frequency, generally between 2 and 70 Hz. An amount of energy equal to that lost by the sample is added during each cycle to keep the sample in oscillation at constant amplitude. As the temperature is changed, the resonant frequency also changes and is monitored by the instrument. The Young's modulus at any temperature is proportional to the square of resonant frequency, so that resonant frequency data as a function of temperature can be converted to Young's modulus as a function of temperature using an equation, which can be found in "Instruction Manual, 981 Dynamic Mechanical Analyzer", PN 980010-000, E.I. du Pont de Nemours & Co., Wilmington, Del., 1979, rev. B.

A control plot for a commercial fluoropolymer, designated "PFA", also was obtained.

Interpretation of Curves: The ordinate of the plot is the dynamic modulus in Gpa. The curve is characterized by a gently decreasing modulus as temperature increases until the Tg of the resin is encountered (upper use temperature), at which point the decrease in modulus becomes very steep. The curve clearly shows the superior modulus of the PDD dipolymer in comparison to commercial fluoropolymer. At all temperatures within the working limits of the PDD dipolymer (below the Tg), its dynamic modulus is substantially higher than that of the commercial resin. The horizontal line at 5.5 GPa is a visual aid. It emphasizes that at 200° C., the polymer of this invention has a modulus equivalent to that of PFA at room temperature.

EXAMPLE 6

A dipolymer of PDD with TFE was prepared according to the general technique described herein. It contained about 90 mole % PDD. Thermal coefficient of expansion was determined for this sample using a Du Pont 943 thermomechanical analyzer controlled by a Du Pont 990 thermal analyzer. The method was similar to that described in ASTM method E-8318-81 but was modified to test polymer samples in tension in the form of thin films. The thermal coefficient of expansion of the clamps used to hold the sample was determined by measuring the apparent change in length of a standard quartz rod clamped in the instrument over the temperature range of interest. A standard copper sample was next measured over the same temperature range. The actual, corrected change in length of the copper sample was obtained as the difference between the quartz and copper data. Since thermal coefficient of expansion of copper as a function of temperature is accurately known, the constant relating change in length to thermal coefficient of expansion can be calculated as a function of temperature for the instrument.

In order to measure thermal coefficient of expansion for a polymer sample, a thin film of the sample, generally between 0.127 and 0.381 mm thick, was mounted in the instrument, and the change in length as a function of temperature was measured over the indicated temperature range at a controlled rate of 10° C./min. Each sample was heated through the indicated temperature range twice, data from the second heating being used to calculate thermal coefficient of expansion versus temperature. For comparison, similar measurements were made on commercial samples of Du Pont tetrafluoroethylene copolymers with hexafluoropropylene (TEFLON ® FEP fluorocarbon resin) and with perfluoro(propyl vinyl ether) (TEFLON ® PFA fluorocarbon resin), as well as with commercial tetrafluoroethylene homopolymer (TEFLON ® TFE fluorocarbon resin). The results are shown in Table V, below.

TABLE V

| Copolymer Type | Thermal Coefficient of Expansion (mm/mm/°C. × $10^{-5}$) | |
|---|---|---|
| | Th. Coeff. of Exp. | Range (°C.) |
| PDD/TFE | 4.8 | 30–275 |
| TEFLON ® PFA-500 LP | 12.6 | 20–220 |
| TEFLON ® FEP 100 | 14.6 | 20–220 |
| TEFLON ® TFE | 14.6 | 20–220 |

The above data show that the PDD/TFE copolymer of this invention has a very low coefficient of thermal expansion, as compared with commercial polymers of tetrafluoroethylene, and thus is particularly suitable for applications where such property is important, for example, in metal/plastic or plastic/plastic laminates for use in flexible circuits or high speed computer interconnects.

EXAMPLE 7

A cold 240 mL Hastelloy ™ C shaker tube was charged with 80 g of 1,1,2-trichloro-1,2,2-trifluoroethane, 15 g (0.0615 mole) of PDD, 2 g (0.00474 mole) of EVE and 0.05g of 4,4'-bis(t-butylcyclohexyl) peroxydicarbonate. The tube was sealed, evacuated while cold, and was charged with 0.8 g (±0.2 g) (0.008 mole) of TFE. The tube was agitated at 40° C. for 12 hours. The resulting terpolymer was collected and dried 20 hours in a vacuum oven at 120° C. A white resin 10.5 g (59% conversion) was obtained. This terpolymer was amorphous and had a Tg of 162° C. The inherent viscosity of the terpolymer was 0.0734 $m^3$/kg, as measured at 25° C. in a 3.33 kg/$m^3$ solution in FC-75. The terpolymer had a composition of PDD/TFE/EVE=79.5/16.5/4.0 (mole %) as determined by F-19 NMR spectroscopy.

I claim:

1. An article for handling or processing of fluids selected from the group consisting of pipes, tubings, fittings, pump housings, pump impellers, valve bodies, valve stems, valve seals, diaphragms, tanks, trays, pipettes, and laboratory vessels, wherein at least one of the surfaces coming in contact with fluids is made of an amorphous dipolymer of 65–99 mole % of perfluoro-2,2-dimethyl-1,3-dioxide with a complementary amount of tetrafluoroethylene, the glass transition temperature of the dipolymer beings at least 140° C.

2. A container or component of a conveying system suitable for holding or transporting articles in contact with a corrosive fluid selected from the group consisting of baskets, guide rails, conveyer belt links, bearings and rollers, clamps, racks, hooks, positioning pins, robot arm jaws and fingers, gears, and cams, said container or component being made of an amorphous dipolymer of 65–99 mole % of perfluoro-2,2-dimethyl-1,3-dioxole with a complementary amount of tetrafluoroethylene, the glass transition temperature of the dipolymer being at least 140° C.

* * * * *

UNITED STATES PATENT AND TRADEMARK OFFICE
CERTIFICATE OF CORRECTION

PATENT NO. : 5,006,382
DATED : APRIL 9, 1991
INVENTOR(S) : EDWARD N. SQUIRE

It is certified that error appears in the above—identified patent and that said Letters Patent is hereby corrected as shown below:

Claim 1, Column 14, line 15, "2,2-dimethyl-1,3-dioxide" should be amended to read -- 2,2-dimethyl-1,3-dioxole --.

Signed and Sealed this

Eighteenth Day of August, 1992

Attest:

DOUGLAS B. COMER

Attesting Officer

Acting Commissioner of Patents and Trademarks